US010879548B2

(12) United States Patent
Yamane

(10) Patent No.: US 10,879,548 B2
(45) Date of Patent: Dec. 29, 2020

(54) POWER GENERATION SYSTEM, METHOD FOR CONTROLLING POWER GENERATION SYSTEM, AND POWER GENERATION APPARATUS

(71) Applicant: KYOCERA Corporation, Kyoto (JP)

(72) Inventor: Takeshi Yamane, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 209 days.

(21) Appl. No.: 16/073,762

(22) PCT Filed: Jan. 26, 2017

(86) PCT No.: PCT/JP2017/002757
§ 371 (c)(1),
(2) Date: Jul. 27, 2018

(87) PCT Pub. No.: WO2017/131094
PCT Pub. Date: Aug. 3, 2017

(65) Prior Publication Data
US 2019/0036141 A1 Jan. 31, 2019

(30) Foreign Application Priority Data
Jan. 28, 2016 (JP) .................................. 2016-014834

(51) Int. Cl.
H01M 8/04858 (2016.01)
H02J 3/46 (2006.01)
(Continued)

(52) U.S. Cl.
CPC .. *H01M 8/04858* (2013.01); *G01R 19/16547* (2013.01); *G01R 21/133* (2013.01);
(Continued)

(58) Field of Classification Search
CPC ...... H01M 8/04858; H01M 8/10; H01M 8/12; G01R 19/16547; G01R 21/133;
(Continued)

(56) References Cited

U.S. PATENT DOCUMENTS

2004/0032127 A1   2/2004   Tokiwa et al.
2017/0141579 A1   5/2017   Kuwahara

FOREIGN PATENT DOCUMENTS

JP   S55-74238 U1   5/1980
JP   2002-247765 A   8/2002
(Continued)

OTHER PUBLICATIONS

International Search Report in PCT Application No. PCT/JP2017/002757, dated Mar. 14, 2017, 4pp.

*Primary Examiner* — Hal Kaplan
(74) *Attorney, Agent, or Firm* — Hauptman Ham, LLP

(57) ABSTRACT

A power generation system includes a plurality of power generation apparatuses. The power generation system is configured to supply electric power to a load by performing interconnecting operation of the plurality of power generation apparatuses sets one of the plurality of apparatuses as a master apparatus and the other power generation apparatus as a slave apparatus. When power consumption by the load is less than electric power, the master apparatus causes the master apparatus and the slave apparatus to generate power in such a manner that the electric power supplied to the load follows the power consumption by the load. The electric power is generated by rated operation of the master apparatus and the slave apparatus.

11 Claims, 5 Drawing Sheets

(51) Int. Cl.
*G01R 19/165* (2006.01)
*G05B 13/02* (2006.01)
*H02J 3/38* (2006.01)
*H02M 7/493* (2007.01)
*G01R 21/133* (2006.01)
*H01M 8/10* (2016.01)
*H01M 8/12* (2016.01)

(52) U.S. Cl.
CPC ............ *G05B 13/024* (2013.01); *H02J 3/387* (2013.01); *H02J 3/46* (2013.01); *H01M 8/10* (2013.01); *H01M 8/12* (2013.01); *H02M 7/493* (2013.01)

(58) Field of Classification Search
CPC .......... G05B 13/024; H02J 3/387; H02J 3/46; H02M 7/493
USPC .......................................................... 307/65
See application file for complete search history.

(56) References Cited

FOREIGN PATENT DOCUMENTS

| | | |
|---|---|---|
| JP | 4718133 B2 | 7/2011 |
| WO | 2011/055226 A2 | 5/2011 |
| WO | 2016/006257 A1 | 1/2016 |

POWER GENERATION SYSTEM, METHOD FOR CONTROLLING POWER GENERATION SYSTEM, AND POWER GENERATION APPARATUS

CROSS REFERENCE TO RELATED APPLICATION

This application is a National Phase of International Application Number PCT/JP2017/002757, filed Jan. 26, 2017, and claims priority to and the benefit of Japanese Patent Application No. 2016-014834 filed on Jan. 28, 2016.

TECHNICAL FIELD

The disclosure relates to a power generation system, a control method for the power generation system, and a power generation apparatus.

BACKGROUND

Recently, power generation systems which include a plurality of distributed power sources such as solar cells and fuel cells for functioning as power generation apparatuses coupled to one another and supply power generated by the power generation apparatuses are studied.

In order to improve energy recovery efficiency, when each of the distributed power sources performs interconnecting operation, the power generation systems perform load-following operation for controlling power generation output by the power generation system in accordance with a change in a load.

SUMMARY

A power generation system according to an embodiment of the present disclosure includes a plurality of power generation apparatuses and supplies power to a load by performing interconnecting operation of the plurality of power generation apparatuses. The power generation system sets one of the plurality of power generation apparatuses as a master apparatus and the other power generation apparatus as a slave apparatus. When power consumption by the load is less than electric power generated by rated operation of the master apparatus and the slave apparatus, the master apparatus causes the master apparatus and the slave apparatus to generate electric power in such a manner that the electric power supplied to the load follows the power consumption by the load.

A control method for a power generation system according to an embodiment of the present disclosure includes a plurality of power generation apparatuses and supplies electric power to a load by performing interconnecting operation of the plurality of power generation apparatuses. The control method includes a step of setting one of the plurality of power generation apparatuses as a master apparatus and the other power generation apparatus as a slave apparatus. The control method includes a control step in which the master apparatus, when power consumption by the load is less than electric power generated by rated operation of the master apparatus and the slave apparatus, causes the master apparatus and the slave apparatus to generate electric power in such a manner that the electric power supplied to the load follows the power consumption by the load.

A power generation apparatus according to an embodiment of the present disclosure includes a power generator configured to generate electric power supplied to a load and a controller configured to control power generation output by the power generator. When the controller conducts distribution control of the electric power supplied to the load by performing interconnecting operation of the power generation apparatus and at least one other power generation apparatus and, simultaneously, power consumption by the load is less than the electric power generated by rated operation of each of the power generation apparatus and the at least one other power generation apparatus, the controller causes the power generation apparatus and the at least one other power generation apparatus to generate electric power in such a manner that the electric power supplied to the load follows the power consumption by the load.

DETAILED DESCRIPTION

A distributed power source such as a fuel cell can generate electric power most efficiently when performing rated operation. On the other hand, in order to improve energy recovery efficiency of a power generation system as a whole, the power generation system should perform load-following operation mentioned above. In this case, the power generation system performs distribution control of electric power supplied to a load coupled to the distributed power sources between each of the distributed power sources. Depending on a method of the distribution control of the load, accordingly, the power generation efficiency of each of the distributed power sources may decrease, possibly reducing the energy recovery efficiency of the power generation system. A power generation system, a control method for the power generation system, and a power generation apparatus according to the present disclosure are capable of improving the energy recovery efficiently in performing the load-following operation.

Hereinafter, embodiments will be described in detail with reference to the accompanying drawings.

First Embodiment

Figure 1:
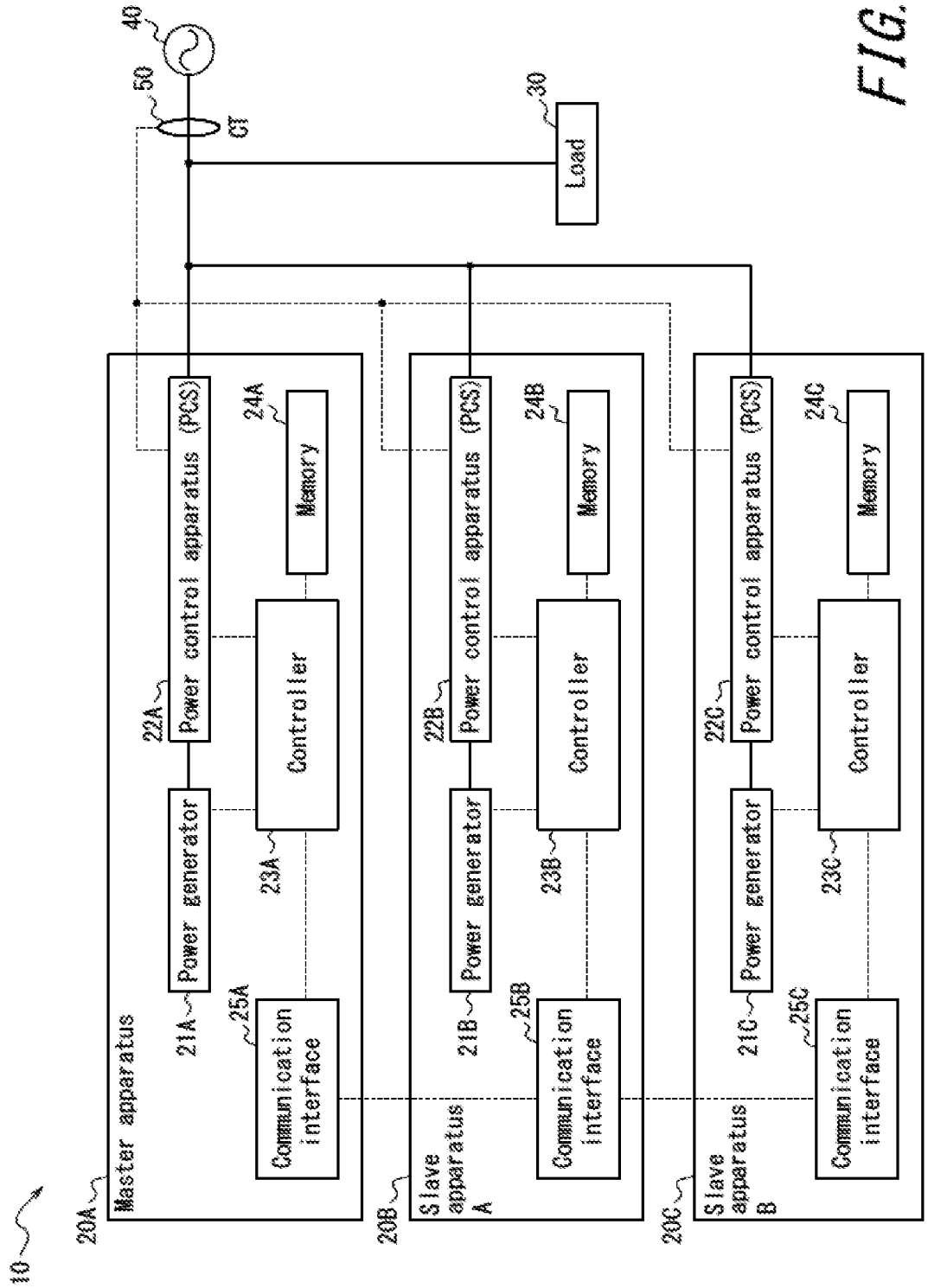
FIG. 1 is a functional block diagram schematically illustrating a power generation system including power generation apparatuses according to a first embodiment.

A power generation system 10 includes a plurality of power generation apparatuses. The power generation system 10 according to the present embodiment includes power generation apparatuses 20A, 20B, and 20C as illustrated in FIG. 1. Note that the power generation system 10 may include any number of power generation apparatuses similar to the power generation apparatuses 20A, 20B, and 20C. Hereinafter, descriptions of well-known elements and functional units will be appropriately simplified or omitted.

The power generation apparatuses 20A, 20B, and 20C are fuel cells, for example The power generation apparatuses 20A, 20B, and 20C are coupled to a load 30 in parallel and perform interconnecting operation. Each of the power generation apparatuses 20A, 20B, and 20C generates electric power supplied to the load 30 in association with, for example, a power grid 40. The power grid 40 is a power system for integrating power generation, power transformation, power transmission, and power distribution which are necessary for a consumer facility to receive electric power. In other words, the power grid 40 includes power distribution equipment used by the consumer facility to receive the electric power supply.

As illustrated in FIG. 1, the power generation apparatus 20A includes a power generator 21A, a power control apparatus (PCS) 22A, a controller 23A, a memory 24A, and a communication interface 25A. In FIG. 1, a solid line represents a power path, and a broken line represents a path of a control signal or various information communicated.

The power generator 21A includes, for example, a cell stack and generates DC power. The cell stack is a fuel cell such as a polymer electrolyte fuel cell (PEFC) or a solid oxide fuel cell (SOFC), and is not limited thereto. Power generation by the power generator 21A is controlled by the controller 23A. According to the present embodiment, the electric power generated by the power generator 21A cannot be sold to the power grid 40, i.e., cannot be flown in reverse.

Here, the sale of electric power means supplying electric power to a power company by supplying electric power from the distributed power source such as a solar power generator and thus selling unused electric power obtained by subtracting electric power consumed in the consumer facility from the electric power supplied to the consumer facility.

The reverse power flow means flow of an electric current from the power generation system 10 to the power grid 40. The "electric power that cannot be flown in reverse" is electric power based on energy supplied from an infrastructure such as, for example, electric power generated by a fuel cell, whose sale is currently banned in Japan. According to the present embodiment, thus, the power generator 21A is different from a power generator equipped with, for example, a solar cell for performing solar power generation whose power can be sold to the power grid 40. Hereinafter, the power generator 21A is described as a SOFC, by way of example However, the power generator 21A is not limited to a SOFC, and may typically be a power generator of various types equipped with a fuel cell.

The power generator 21A may generate electric power by using a fuel cell power generation apparatus configured to cause electrochemical reaction of gases such as hydrogen and oxygen supplied from an external source. According to the present embodiment, the power generator 21A starts operation upon receiving electric power from the power grid 40 and, from then, may run without receiving electric power from the power grid 18, i.e., may perform what is called autonomous operation.

According to the present embodiment, the power generator 21 includes other functional units including a reforming unit, as necessary, in order to be able to perform autonomous operation. According to the present embodiment, the power generator 21A may be a well-known fuel cell, and thus a further detailed description of the fuel cell will be omitted.

The DC power generated by the power generator 21A is converted into AC power by the power control apparatus 22A and then supplied to the load 30, which may be of a various type and consumes AC power. Here, the AC power output from the power generation apparatus 20 is supplied to the load 30 via a distribution board in a house and the like, in practice. FIG. 1 omits units including the distribution board.

The power control apparatus 22A converts the DC power generated by the power generator 21A into AC power and supplies the AC power to the load 30. In particular, the power control apparatus 22A steps up or steps down the DC power generated by the power generator 21A by using a DC/DC converter and then converts the resulting DC power into the AC power by using a DC/AC inverter. The power control apparatus 22A may be implemented by a common inverter with a well-known configuration. Thus, a detailed description of the power control apparatus 22A will be omitted. Output of the AC power by the power control apparatus 22A is controlled by the controller 23A.

The controller 23A controls and manages the power generation apparatus 20A in its entirety including each functional unit thereof. According to the present embodiment, as described later, the controller 23A sets the power generation apparatus 20A as a master apparatus and the power generation apparatuses 20B and 20C as slave apparatuses. Thus, the controller 23A also controls and manages the power control apparatuses 20B and 20C in their entirety including each functional unit thereof via the communication interface 25A. The controller 23A is implemented by a processor such as a CPU (Central Processing Unit) or the like configured to execute a program specifying a control procedure. This program is stored in, for example, the memory 24A or an external storage medium.

According to the present embodiment, the controller 23 controls power output by each of the power generation apparatuses 20A, 20B, and 20C. To that end, the controller 23A is capable of controlling, for example, the power generation by the power generator 21A and output by the power control apparatus 22A. As illustrated in FIG. 1, the controller 23A is coupled to the power generator 21A and the power control apparatus 22A via control lines. In the present specification, control by the controller 23A according to the present embodiment and other embodiments will be mainly described.

The memory 24A may be implemented by a semiconductor memory or a magnetic memory. The memory 24A stores various information and programs for operating the power generation apparatuses 20A, 20B, and 20C and also functions as a working memory. According to the present embodiment, the memory 24A also stores algorithm for various arithmetic processing performed by the controller 23A and various reference tables such as lookup tables (LUTs). An example of the information stored in the memory 24A will be appropriately described in the description of the control by the controller 23A and the like discussed below.

The communication interface 25A transmits the control signal from the controller 23A to the power generation apparatuses 20B and 20C. For example, the controller 25A receives the control signal for controlling the power generation output by the power generation apparatuses 20B and 20C from the controller 23A and transmits the control signal to the power generation apparatuses 20B and 20C.

The communication interface 25A receives various information transmitted from the power generation apparatuses 20B and 20C. For example, the communication interface 25A receives information about current power generation output by the power generation apparatuses 20B and 20C. The communication interface 25A transmits received information to the controller 23A.

The power generation apparatus 20B includes a power generator 21B configured to generate power supplied to the load 30, a power control apparatus 22B configured to convert DC power generated by the power generator 21B into AC power and supply the AC power to the load 30, and a communication interface 25B configured to communicate with the controller 23A via the communication interface 25A. The power generation apparatus 20B includes a controller 23B configured to control and manage the power generation apparatus 20B in its entirety including each functional unit thereof, and a memory 24B for storing various information and programs. The power generation apparatus 20C includes a power generator 21C configured to generate electric power supplied to the load 30, a power control apparatus 22C configured to convert DC power generated by the power generator 21C into AC power and supply the AC power to the load 30, and a communication interface 25C configured to communicate with the controller 23A via the communication interface 25A. The power generation apparatus 20C includes a controller 23C configured to control the power generation apparatus 20C in its entirety including each functional unit thereof, and a memory 24C for storing various information and programs.

Although in FIG. 1 the power generation apparatus 20A serves as the master apparatus and the controller 23A controls the power generation system 10 in its entirety including the power generation apparatus 20A and the power generation apparatuses 20B and 20C serving as the slave apparatuses, this configuration is not restrictive and various configuration may be employed. For example, the power generation apparatuses 20B and 20C may serve as master apparatuses. The power generation system 10 may have a configuration in which each of the controllers of the power generation apparatuses controls the power generation output and the like from the power generation apparatuses by working in association with one another.

As illustrated in FIG. 1, in the power generation system 10 the power generation apparatus 20A is coupled to the power generation apparatuses 20B and 20C. As described above, each of the power generation apparatuses 20A, 20B, and 20C may be implemented by the distributed power source. Although in FIG. 1 the DC power generated by the power generators 21A, 21B, and 21C is converted into AC power before being combined, the power generation system 10 according to the present embodiment is not limited to this configuration and may combine the DC power.

The load 30 may be an apparatus of various types such as household appliance which receives electric power from the power generation system 10 for use by a user. Although the load 30 is illustrated as one apparatus in FIG. 1, the load 30 is not limited thereto and may include any number of apparatuses.

The current sensor 50 is, for example, a CT (Current Transformer). However, the current sensor 50 may be any appropriate apparatus that is capable of detecting a current value and a current direction.

The current sensor 50 may detect whether the power output by the power generation system 10 flows in reverse to the power grid 40. To that end, as illustrated in FIG. 1, the current sensor 50 is arranged in a position for detecting power output by the power generation apparatuses 20A, 20B, and 20C and supplied to the power grid 40 after being supplied to the load 30. Information about the current value and the current direction detected by the current sensor 50 is directly or indirectly supplied to the controller 23A via a wired or wireless communication. The controller 23A may calculate reverse-flowing power on the basis of the current value and the current direction detected by the current sensor 50 and a voltage value supplied to the load 30 measured by, for example, a voltage sensor.

In the power generation system 10 according to the present embodiment, as illustrated in FIG. 1, the power generation apparatus 20A is coupled to the power generation apparatuses 20B and 20C. In particular, the power generation apparatuses 20A, 20B, and 20C are coupled to one another in a communicable manner via the communication interfaces 25A, 25B, and 25C. This coupling may be implemented in a wired or wireless manner. Thus, the power generation apparatuses 20A, 20B, and 20C may exchange and share various information therebetween.

Operation of the power generation apparatuses 20A, 20B, and 20C of the power generation system 10 according to the present embodiment will be described with reference to FIG. 2.

When the power generation system 10 according to the present embodiment starts operation, the controller 23A may set the power generation apparatus 20A, which includes the controller 23A, as a main apparatus (the master apparatus). In this case, the controller 23A may set the power generation apparatuses 20B and 20C, which are not set as the master apparatus, as secondary apparatuses (the slave apparatuses). FIGS. 1 and 2 illustrate an example in which the power generation apparatus 20A serves as the master apparatus, and the controller 23A controls operation of the power generation apparatus 20B serving as a slave apparatus A and operation of the power generation apparatus 20C serving as a slave apparatus B.

According to the present embodiment, the controller 23A causes the power generation system 10 to perform the interconnecting operation following the load 30. The controller 23A performs distribution control of the electric power supplied to the load 30 between the power generation apparatuses 20A, 20B, and 20C which are in interconnecting operation. When the power consumption by the load 30 is less than the electric power generated by the rated operation of the power generation apparatus 20A serving as the master apparatus and the power generation apparatuses 20B and 20C serving as the slave apparatuses, the controller 23A causes the master apparatus and the slave apparatuses to generate power. Simultaneously, the controller 23A causes the master apparatus and the slave apparatuses to supply electric power following the power consumption by the load 30. The controller 23A may drive at least one of the master apparatus and the slave apparatuses to generate minimum electric power.

Here, the electric power supplied to the load 30 from the power generation system 10 in its entirety is 7 kW, by way of example According to the present embodiment, a maximum power generation output from each of the power generation apparatuses 20A, 20B, and 20C is 3 kW, by way of example For example, the maximum power generation output may be altered by changing the number of cell stacks constituting each of the power generators 21A, 21B, and 21C.

When the power generation system 10 according to the present embodiment performs the distribution control of the electric power supplied to the load 30 between the power generation apparatuses 20A, 20B, and 20C, the controller 23A sets priorities to the power generation apparatuses 20A, 20B, and 20C. As illustrated in FIG. 2, for example, the controller 23A sets the power generation apparatus 20A as a priority 1, which is the highest priority, at a given time. Simultaneously, the controller 23A sets the power generation apparatus 20B as a priority 2 and the power generation apparatus 20C as a priority 3, which is the lowest priority.

The controller 23A controls each of the power generation apparatuses 20A, 20B, and 20C by causing one with the higher priority to preferentially perform the rated operation. FIG. 2 illustrates the example in which the controller 23A causes the power generation apparatuses 20A with the priority 1 and the power generation apparatus 20B with the priority 2 to perform the rated operation to respectively yield the maximum power generation output of 3 kW. On the other hand, the controller 23A causes the power generation apparatus 20C with the priority 3 to perform the load-following operation to output generated power of 1 kW, which is an outstanding amount of the necessary power supply of 7 kW.

Figure 2:
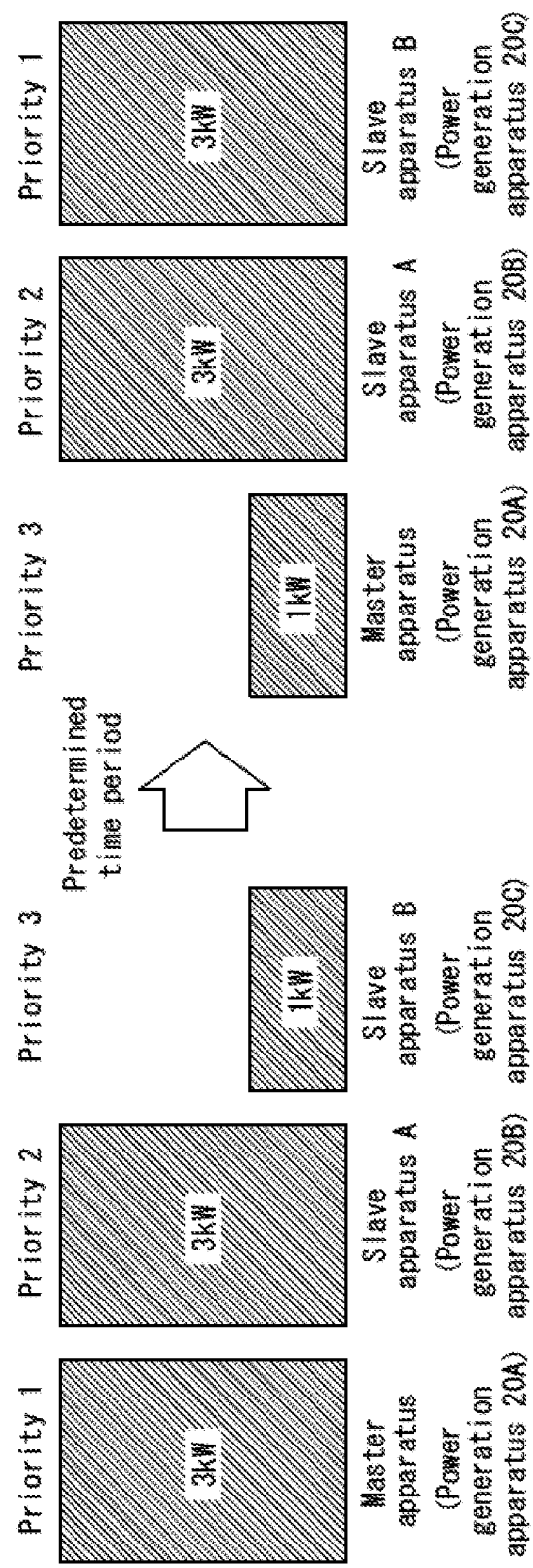
FIG. 2 is schematic view illustrating control by the power generation system of FIG. 1.

Although in FIG. 2 the controller 23A causes the power generation apparatuses 20A and 20B to perform the rated operation, this is not restrictive. For example, the controller 23A may cause the power generation apparatus 20A alone to perform the rated operation. In this case, the power generation apparatus 20A may output generated power of 3 kW, and the power generation apparatuses 20B and 20C may each perform the load-following operation and output generated power of 2 kW.

Although the priority once set as described above may be fixed, after a certain period of time, a degradation degree of the power generation apparatuses 20A and 20B outputting maximum generated power of, for example, 3 kW may be different from a degradation degree of the power generation apparatus 20C outputting the generated power of 1 kW. As such, to avoid unequal degradation degrees among the constituents of the power generation system 10 as described above, the controller 23A renews the priorities set to the power generation apparatuses 20A, 20B, and 20C as illustrated in FIG. 2 after performing the control as described above for a predetermined time period. For example, the controller 23A changes the priority of the power generation apparatus 20A from the priority 1 to the priority 3. Similarly, the controller 23A changes the priority of the power generation apparatus 20C from the priority 3 to the priority 1, while maintaining the power generation apparatus 20B as the priority 2.

After renewing the priorities, the controller 23A, in a manner similar to the control before the renewal, controls each of the power generation apparatuses 20A to 20C such that one with the higher priority preferentially performs the rated operation. FIG. 2 illustrates an example in which the controller 23A causes the power generation apparatuses 20C to which the priority 1 is newly set and the power generation apparatus 20B with the priority 2 to perform the rated operation and output the maximum generated power of 3 kW. On the other hand, the controller 23A causes the power generation apparatus 20A, to which the priority 3 is newly set, to perform the load-following operation and output the outstanding power of 1 kW of the necessary power supply of 7 kW.

The controller 23A is not limited to perform the renewal of the priorities described above and appropriately sets the priorities to obtain optimum energy recovery efficiency from the power generation system 10 as a whole. A priority renewal schedule may be prescribed, or may be determined by the user as desired in accordance with each use case. In either case, the priority renewal schedule is stored in, for example, the memory 24 or an external storage medium. The controller 23A renews the priorities by acquiring data associated with the priority renewal schedule from the memory 24 or the external storage medium.

The controller 23A determines the priorities on the basis of degradation parameters in consideration of various factors of each of the power generation apparatuses 20A, 20B, and 20C such as operation time, initial power generation efficiency, current power generation efficiency, a change rate of the power generation efficiency, a power generation amount, and a change in a maximum power generation amount. To avoid unequal degradation degrees between the constituents of the power generation system 10, the controller 23A should set optimal priorities as appropriate, on the basis of the deterioration parameters.

In this way, the power generation system 10 according to the first embodiment may improve the energy recovery efficiency during the load-following operation.

The power generation system 10 according to the present embodiment sets a priority to each of the power generation apparatuses 20A, 20B, and 20C and thus facilitates implementation of a condition for improving the energy recovery efficiency of the power generation system 10 as a whole. This enables further optimization of the control of the power generation system 10 in its entirety.

The power generation system 10 according to the present embodiment reduces unequal deterioration degrees occurred to the constituents of the power generation system 10 by renewing the priorities at predetermined intervals. Consequently, the constituents of the power generation system 10, i.e., the power generation apparatuses 20A, 20B, and 20C age substantially equally. This eliminates the necessity for the user to replace a part of the power generation system 10 on the basis of the operation time. Thus, the power generation system 10 according to the present embodiment enables relatively easy maintenance thereof.

The power generation system 10 according to the present embodiment allows the user to determine the priority renewal schedule as desired in accordance with each use case, and thus may be more convenient for the user.

The power generation system 10 according to the present embodiment may more accurately find an optimum condition for improving the energy recovery efficiency by determining the priorities on the basis of the degradation parameters in consideration of various factors.

Second Embodiment

A configuration of a power generation system according to a second embodiment is similar to the configuration of the power generation system 10 according to the first embodiment. The power generation system according to the present embodiment controls the power generation output by each of the power generation apparatuses in a manner different from the power generation system 10 according to the first embodiment. Hereinafter, detailed descriptions of the configuration and the constituents of the power generation system according to the second embodiment similar to those of the first embodiment will be omitted, focusing on features specific to the present embodiment. The constituents the same as those of the power generation system 10 according to the first embodiment will be denoted by the same reference signs.

Figure 3:
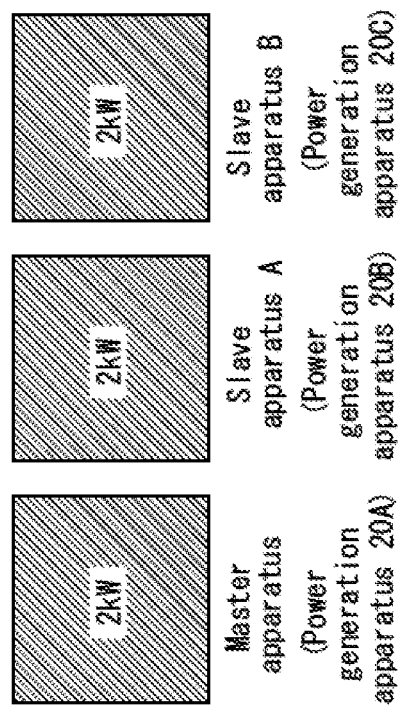
FIG. 3 is a diagram schematically illustrating control by a power generation system according to a second embodiment.

In a manner similar to the first embodiment, when the power generation system 10 according to the present embodiment starts operation, the controller 23A may set the power generation apparatus 20A, which includes the controller 23A, as the master apparatus as illustrated in FIG. 3. Similarly, the controller 23A may set the remaining power generation apparatuses as the slave apparatuses. An example in which the controller 23A sets the power generation apparatus 20A as the master apparatus and controls operation of the power generation apparatus 20B serving as a slave apparatus A and operation of the power generation apparatus 20C serving as a slave apparatus B will be assumed.

Here, the electric power supplied to the load 30 from the power generation system 10 as a whole is, for example, 6 kW. According to the present embodiment, the maximum power generation output by each of the power generation apparatuses 20A, 20B, and 20C is 3 kW, although this is not restrictive. For example, the maximum power generation output may be altered by changing the number of cell stacks constituting each of the power generators 21A, 21B, and 21C.

When the power generation system 10 according to the present embodiment performs the distribution control of the electric power supplied to the load 30 between the power generation apparatuses 20A, 20B, and 20C, the controller 23A controls to equalize each of the power generation output. In FIG. 3, for example, the controller 23A causes each of the power generation apparatus 20An 20B, and 20C to output generated power of 2 kW, which is lower than the maximum power generation output. In this case, unlike the first embodiment, the controller 23A causes all of the power generation apparatuses 20A, 20B, and 20C to perform the load-following operation.

Figure 4:
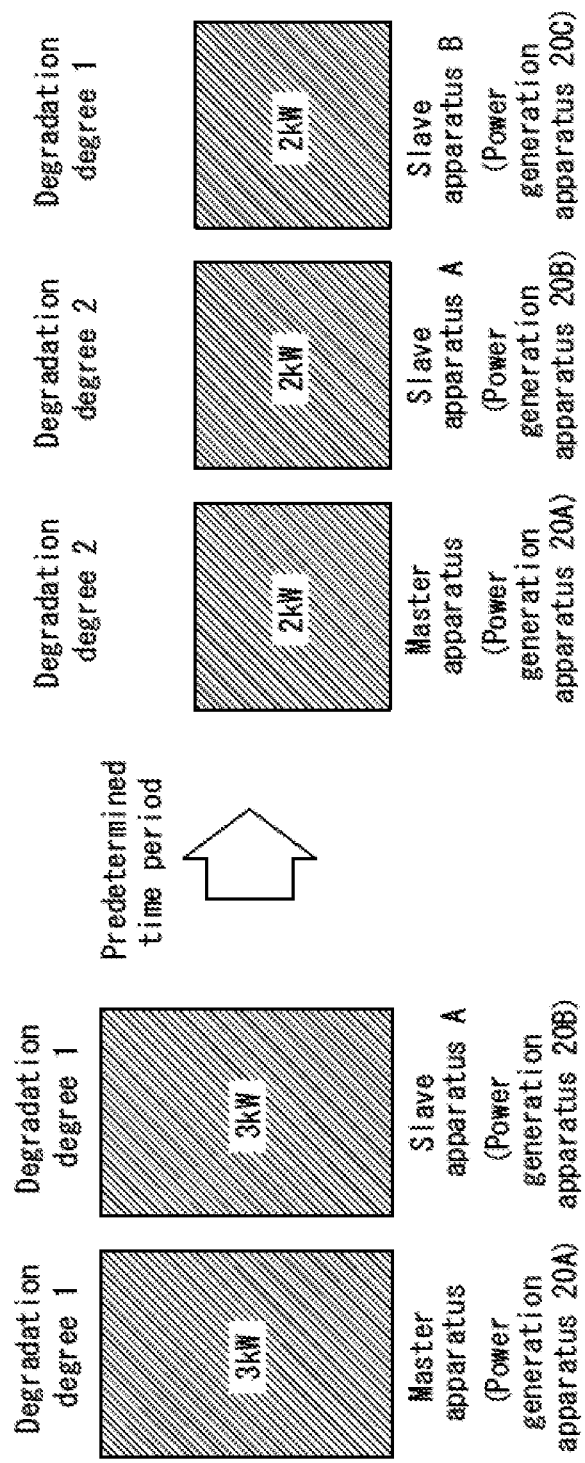
FIG. 4 is a diagram schematically illustrating another example of the control by the power generation system according to the second embodiment.

Although in the above description the power generation system 10 includes the power generation apparatuses 20A, 20B, and 20C from the beginning, this is not restrictive in actual use cases. FIG. 4 is a schematic diagram illustrating control of the power generation system 10 according to the second embodiment in a given use case. As illustrated in FIG. 4, for example, the user may initially purchase the power generation apparatuses 20A and 20B and, after a predetermined time period, purchase the power generation apparatus 20C to be added to the power generation system 10.

In this case, the power generation system 10 supplies generated power of 6 kW from a combination of the power generation apparatus 20A and the power generation apparatus 20B for a predetermined time period. The controller 23A controls to substantially equalize the power generation output. That is, the controller 23A causes each of the power generation apparatus 20A and 20B to supply generated power of 3 kW.

Then, when the power generation apparatus 20C is added to the power generation system 10 by the user after the predetermined time period, the power generation system 10 supplies generated power of 6 kW by using the power generation apparatuses 20A, 20B, and 20C. In one example, the controller 23A may control to substantially equalize the power generation output of the power generation apparatuses 20A to 20C. That is, the controller 23A may cause each of the power generation apparatuses 20A, 20B, and 20C to supply generated power of 2 kW.

In this way, the power generation system 10 according to the second embodiment may improve load-following performance during the load-following operation. That is, the power generation system 10 according to the second embodiment, even when the power consumption by the load suddenly changes, may cause the power generation apparatuses 20A, 20B, and 20C to substantially equally supplement in accordance with a change amount. Accordingly, the power generation system 10 according to the second embodiment may have better load-following property as compared to a case in which some of the power generation apparatuses perform the rated operation.

The power generation system 10 according to the present embodiment causes the power generation apparatuses 20A, 20B, and 20C to perform equal power generation output and thus is capable of further improving the energy recovery efficiency of the power generation system 10 relative to a gas consumption amount.

Third Embodiment

A configuration of a power generation system according to a third embodiment is similar to the configuration of the power generation system 10 according to the first embodiment. The power generation system according to the third embodiment switches over between the control of the power generation system according to the first embodiment and the control of the power generation system according to the second embodiment, depending on situations. Hereinafter, detailed descriptions of the configuration and the constituents of the power generation system according to the third embodiment similar to those of the first and second embodiments will be omitted, focusing on features specific to the present embodiment. The constituents the same as those of the power generation system 10 according to the first embodiment will be denoted by the same reference signs.

Figure 5:
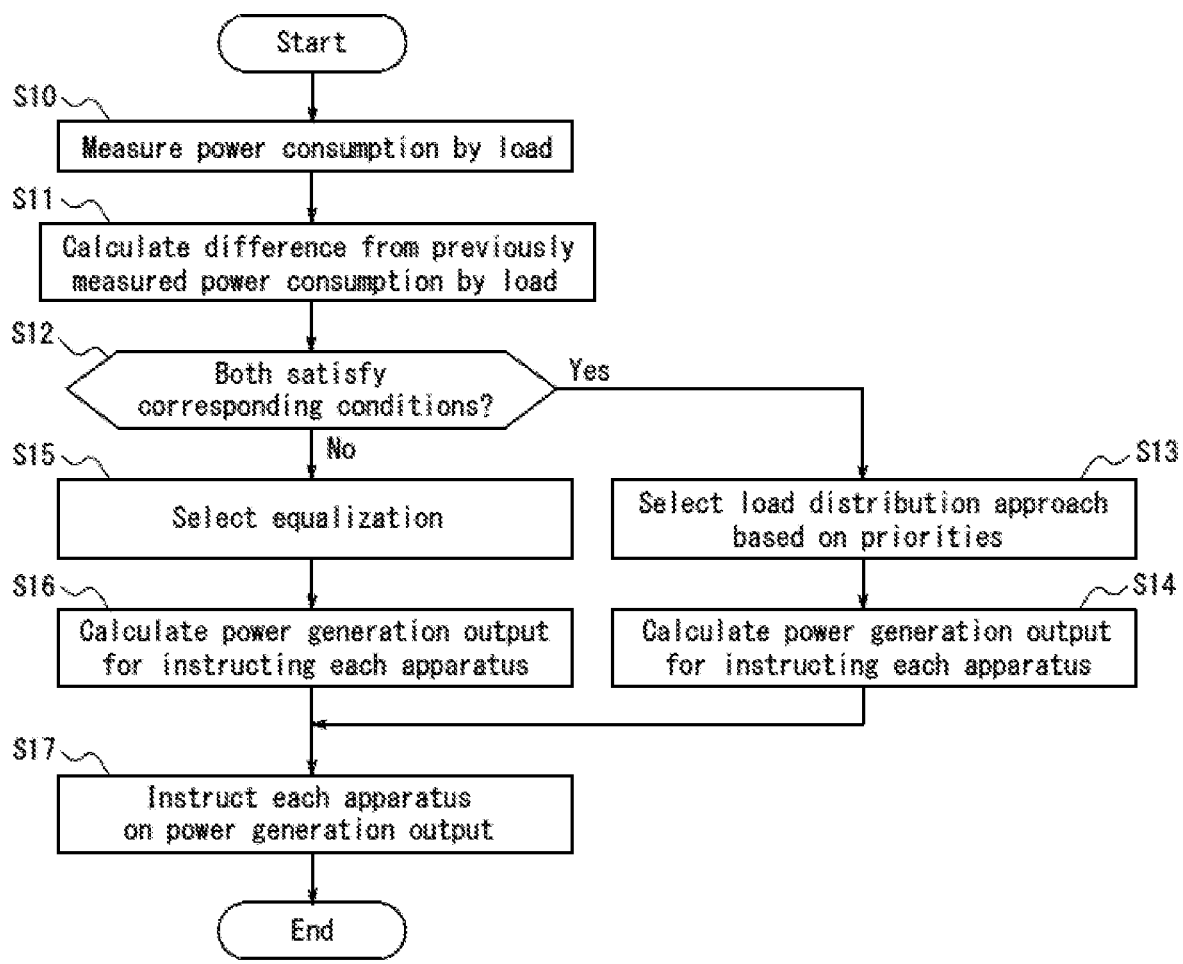
FIG. 5 a flowchart illustrating control by a power generation apparatus according to a third embodiment.

FIG. 5 is a flowchart illustrating control of the power generation system 10 according to the third embodiment. Hereinafter, the control of the power generation system 10 in its entirety performed by the controller 23A according to the present embodiment will be described in detail.

When the flow starts, the controller 23A measures the power consumption of the load 30 coupled to the power generation system 10 (step S10).

The controller 23A, on the basis of the power consumption by the load 30 measured in step S10, calculates a difference from previous power consumption by the load 30 previously measured.

The controller 23A determines whether the power consumption by the load 30 measured in step S10 and the difference from the previous power consumption by the load 30 calculated in step S11 both satisfy corresponding predetermined conditions (step S12). The predetermined condition of the power consumption by the load 30 measured in step S10 is that the power consumption by the load 30 coupled to the power generation system 10 in its entirety is equal to or more than a predetermined threshold. The predetermined condition of the difference from the previous power consumption by the load 30 calculated in step S11 is that the difference within a predetermined time period is equal to or less than a predetermined threshold. These thresholds may be prescribed, or may be determined by the user as desired, depending on each use case. In either case, data associated with the thresholds are stored in, for example, the memory 24 or an external storage medium. The controller 23A acquires the data from the memory 24 or the external storage medium when performing the procedure in step S12.

When the power consumption by the load 30 measured in step S10 and the difference from the previous power consumption by the load 30 calculated in step S11 both satisfy the corresponding predetermined conditions, the controller 23A proceeds to step S13. When at least one of the power consumption by the load 30 measured in step S10 and the difference from the previous power consumption by the load 30 calculated in step S11 does not satisfy the corresponding predetermined condition(s), the controller 23A proceeds to step S15.

When the power consumption by the load 30 measured in step S10 and the difference from the previous power consumption by the load 30 calculated in step S11 both satisfy the corresponding predetermined conditions, the controller 23A selects the load distribution approach in accordance with the priorities as described in the first embodiment (step S13).

The controller 23A calculates the power generation output for instructing each of the power generation apparatuses 20A, 20B, and 20C on the basis of the priorities which have been set (step S14).

In step S12, when the controller 23A determines that at least one of the power consumption by the load 30 measured in step S10 and the difference from the previous power consumption by the load 30 calculated in step S11 does not satisfy the corresponding predetermined condition(s), the controller 23A selects the approach to equalize the power generation output supplied to the load 30 as described in the second embodiment (step S15).

The controller 23A calculates the power generation output for instructing each of the power generation apparatuses 20A, 20B, and 20C (step S16).

The controller 23A instructs each of the power generation apparatuses 20A, 20B, and 20C to meet the power generation output calculated in step S14 or step S16 (step S17). Then, the controller 23A ends the flow.

Although in step S12 described above the controller 23A determines on the basis of the power consumption by the load 30 measured in step S10 and the difference from the previous power consumption by the load 30 measured in step S11, this is not restrictive. For example, the controller 23A may determine whether one of the power consumption by the load 30 measured in step S10 and the difference from the previous power consumption by the load 30 measured in step S11 satisfies the corresponding predetermined condition. In this case, the controller 23A does not need to measure or calculate (step S10 or step S11) the other parameter which will not be used.

In this way, the power generation system 10 according to the third embodiment may have the same effect as those of the first and second embodiments described above in each case. The power generation system 10 may more appropriately determine an optimal condition by appropriately switching over between the control methods on the basis of the power consumption by the load 30 or the difference from the previous power consumption, and thus further improving the energy recovery efficiency.

It is apparent for those who are skilled in the art that the present disclosure may be implemented in manners other than the embodiments described above without departing from the spirit or fundamental features of the present disclosure. Thus, the foregoing description is presented by way of example only and is not in a restrictive manner. The scope of the present disclosure is defined by the appended claims, rather than by the foregoing descriptions. In all modifications, some modifications within an equivalent scope shall be embraced therein.

For example, in the case illustrated in FIG. 4, the degradation degrees of the power generation apparatuses 20A and 20B may be 1 at the beginning and increase to 2 after a predetermined time period. On the other hand, the degradation degree of the power generation apparatus 20C newly added is an initial value of 1. That is, when the power generation apparatus 20C is newly installed after the predetermined time period, the degradation degree of the power generation apparatus 20C differs from the degradation degrees of the power generation apparatuses 20A and 20B.

In this case, when the power generation output by each of the power generation apparatuses 20A, 20B, and 20C is controlled in the same manner as the control described in the second embodiment, a working rate of the power generation system 10 as a whole cannot be an optimal value. In this case, accordingly, instead of equalizing the power generation output by the power generation apparatuses 20A, 20B, and 20C, the power generation system 10 may, for example, change the power generation output by the power generation apparatuses 20A, 20B, and 20C in accordance with the degradation degrees thereof, in a manner similar to the control described in the first embodiment.

The power generation system 10 may increase an operation rate of the power generation system 10 as a whole by appropriately changing the power generation output, such as when the power generation apparatus 20C is added later as described above.

The invention claimed is:

1. A power generation system comprising a plurality of power generation apparatuses and configured to supply electric power to a load by performing interconnecting operation of the plurality of power generation apparatuses, wherein
    one of the plurality of power generation apparatuses is set as a master apparatus and the other power generation apparatus is set as a slave apparatus,
    when power consumption by the load is less than electric power generated by rated operation of the master apparatus and the slave apparatus, the master apparatus causes the master apparatus and the slave apparatus to generate electric power in such a manner that the electric power supplied to the load follows the power consumption by the load,
    the master apparatus sets priorities to the master apparatus and the slave apparatus and controls such that an apparatus with a higher priority preferentially performs the rated operation, and
    the master apparatus measures the power consumption by the load and, when the master apparatus determines that the power consumption is equal to or more than a threshold, sets the priorities and switches to a control to cause an apparatus with a higher priority to perform rated operation and, when the master apparatus determines that the power consumption by the load is less than the threshold, switches to a control to equalize power generation outputs by the master apparatus and the slave apparatus.

2. The power generation system according to claim 1, wherein the master apparatus drives at least one of the master apparatus and the slave apparatus to generate minimum electric power.

3. The power generation system according to claim 1, wherein the master apparatus renews the priorities at predetermined intervals.

4. The power generation system according to claim 1, wherein the master apparatus determines the priorities on the basis of
    a degradation parameter of each of the master apparatus and the slave apparatus, the degradation parameter including operation time, and
    power generation efficiency.

5. A control method for a power generation system including a plurality of power generation apparatuses and configured to supply electric power to a load by performing interconnecting operation of the plurality of power generation apparatuses, the control method comprising:

a step of setting one of the plurality of power generation apparatuses as a master apparatus and the other power generation apparatus as a slave apparatus; and a control step in which, when power consumption by the load is less than electric power generated by rated operation of the master apparatus and the slave apparatus, the master apparatus causes the master apparatus and the slave apparatus to generate power in such a manner that the electric power supplied to the load follows the power consumption by the load, wherein the master apparatus sets priorities to the master apparatus and the slave apparatus and controls such that an apparatus with a higher priority preferentially performs the rated operation, and wherein the master apparatus measures the power consumption by the load and, when the master apparatus determines that the power consumption is equal to or more than a threshold, sets the priorities and switches to a control to cause an apparatus with a higher priority to perform rated operation and, when the master apparatus determines that the power consumption by the load is less than the threshold, switches to a control to equalize power generation outputs by the master apparatus and the slave apparatus.

6. The control method for a power generation system according to claim 5, comprising:

a control step in which the master apparatus drives at least one of the master apparatus and the slave apparatus to generate minimum electric power.

7. The control method for a power generation system according to claim 5, comprising:

a control step in which the master apparatus renews the priorities at predetermined intervals.

8. A power generation apparatus comprising:

a power generator configured to generate electric power supplied to a load; and a controller configured to control power generation output by the power generator, wherein when the controller conducts distribution control of the electric power supplied to the load by performing interconnecting operation of the power generation apparatus and at least one other power generation apparatus and, simultaneously, power consumption by the load is less than the electric power generated by the rated operation of each of the power generation apparatus and the at least one other power generation apparatus, the controller causes the power generation apparatus and the at least one other power generation apparatus to generate electric power in such a manner that the electric power supplied to the load follows the power consumption by the load, the controller sets priorities to the power generation apparatus and the at least one other power apparatus and causes an apparatus with a higher priority to perform the rated operation, and the controller measures the power consumption by the load and, when the controller determines that the power consumption is equal to or more than a threshold, sets the priorities and switches to a control to cause an apparatus with a higher priority to preferentially perform rated operation and, when the controller determines that the power consumption by the load is less than the threshold, switches to a control to equalize power generation outputs by the controller and the at least one other power generation apparatus.

9. The power generation apparatus according to claim 8, wherein the controller drives at least one of the power generation apparatus and the at least one other power generation apparatus to generate minimum electric power.

10. The power generation apparatus according to claim 8, wherein the controller renews the priorities at predetermined intervals.

11. The power generation apparatus according to claim 8, wherein the controller determines the priorities on the basis of degradation parameters of each of the power generation apparatus and the at least one other power generation apparatus, the degradation parameters including operation time, and power generation efficiency.

\* \* \* \* \*